(12) United States Patent
Kuno et al.

(10) Patent No.: US 12,087,610 B2
(45) Date of Patent: Sep. 10, 2024

(54) MEMBER FOR SEMICONDUCTOR MANUFACTURING APPARATUS

(71) Applicant: NGK Insulators, Ltd., Nagoya (JP)

(72) Inventors: Tatsuya Kuno, Nagoya (JP); Seiya Inoue, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 193 days.

(21) Appl. No.: 17/809,567

(22) Filed: Jun. 29, 2022

(65) Prior Publication Data

US 2023/0115033 A1     Apr. 13, 2023

(30) Foreign Application Priority Data

Oct. 7, 2021   (JP) .................................. 2021-165314

(51) Int. Cl.
*H01L 21/683* (2006.01)
*H01J 37/32* (2006.01)

(52) U.S. Cl.
CPC .... *H01L 21/6833* (2013.01); *H01J 37/32715* (2013.01); *H01J 2237/2007* (2013.01)

(58) Field of Classification Search
CPC .................................................. H01L 21/6833
See application file for complete search history.

(56) References Cited

U.S. PATENT DOCUMENTS

| | | | |
|---|---|---|---|
| 6,490,145 B1 * | 12/2002 | Kholodenko | ....... H01L 21/6833 361/234 |
| 9,165,813 B2 * | 10/2015 | Kataigi | ............... H01L 21/6833 |
| 2007/0144667 A1 | 6/2007 | Hattori | |
| 2013/0286532 A1 | 10/2013 | Kataigi et al. | |
| 2019/0035667 A1 | 1/2019 | Minemura | |
| 2020/0135529 A1 | 4/2020 | Shiraishi et al. | |
| 2020/0227291 A1 | 7/2020 | Ishikawa et al. | |
| 2020/0294838 A1 | 9/2020 | Yoshikawa et al. | |
| 2022/0032501 A1 | 2/2022 | Aoki et al. | |

FOREIGN PATENT DOCUMENTS

| | | |
|---|---|---|
| JP | 2000-252270 A | 9/2000 |
| JP | 2013-232640 A | 11/2013 |
| JP | 2019-029384 A | 2/2019 |

(Continued)

OTHER PUBLICATIONS

Korean Office Action (with English translation) dated Jan. 5, 2024 (Application No. 10-2022-0081764).

(Continued)

*Primary Examiner* — Scott Bauer
(74) *Attorney, Agent, or Firm* — BURR PATENT LAW, PLLC

(57) ABSTRACT

A member for semiconductor manufacturing apparatus includes a ceramic plate that has an upper surface including a wafer placement surface and that contains an electrode; a plug insertion hole that is formed as at least a portion of a through-hole extending through the ceramic plate in an up-down direction, an internal thread portion being on an inner circumferential surface around the plug insertion hole; and an insulating plug that includes an external thread portion screwed on the internal thread portion on an outer circumferential surface and that allows gas to pass therethrough.

17 Claims, 7 Drawing Sheets

(56) References Cited

FOREIGN PATENT DOCUMENTS

| | | | |
|---|---|---|---|
| JP | 2020-072262 | A | 5/2020 |
| JP | 2020-150071 | A | 9/2020 |
| KR | 10-2020-0036791 | A | 4/2020 |
| KR | 10-2020-0109253 | A | 9/2020 |
| TW | 200732272 | A | 9/2007 |
| TW | 202025371 | A | 7/2020 |
| TW | 202043174 | A | 12/2020 |

OTHER PUBLICATIONS

Taiwanese Office Action (Application No. 111125849) dated Feb. 24, 2023.

\* cited by examiner

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

A known member for semiconductor manufacturing apparatus includes an electrostatic chuck that has an upper surface including a wafer placement surface. For example, an electrostatic chuck in PTL 1 that includes a ceramic plate on which a wafer is attracted and held, a through-hole that is formed in the ceramic plate, and a porous plug that is disposed in the through-hole is disclosed. To manufacture such an electrostatic chuck, the ceramic plate is first manufactured by firing a green sheet that contains an electrostatic electrode, and the through-hole is formed in the ceramic plate. Subsequently, ceramic mixture paste that contains ceramic particles and particles to be annihilated by firing is filled in the through-hole and is heated to a predetermined temperature. Consequently, the ceramic particles in the mixture are fired, and the particles to be annihilated by firing are annihilated. In this way, the porous plug is formed in the through-hole, and the electrostatic chuck described above is obtained. As for the electrostatic chuck, helium gas is introduced into the porous plug from the outside with the wafer electrostatically attracted to the wafer placement surface. The helium gas is then supplied to a back surface of the wafer, and heat conduction between the wafer and the ceramic plate is improved. At this time, the helium gas passes through pores of the porous plug, and this inhibits spark discharge from occurring near the back surface of the wafer unlike the case where helium gas passes through a through-hole in which no porous plug is present. When the spark discharge occurs near the back surface of the wafer, the quality of the wafer changes, and the wafer cannot be used as a device, which is not preferable.

CITATION LIST

Patent Literature

PTL 1: Japanese Unexamined Patent Application Publication No. 2019-29384

SUMMARY OF THE INVENTION

However, a firing process needs to be performed twice for the electrostatic chuck described above. That is, the firing process needs to be performed in a process of manufacturing the ceramic plate and a process of manufacturing the porous plug. For this reason, there is a problem in that manufacturing costs increase.

The present invention has been accomplished to solve the problem, and it is a main object of the present invention to provide a member for semiconductor manufacturing apparatus that includes a plug that allows gas to pass therethrough at low costs.

A member for semiconductor manufacturing apparatus of the present invention includes: a ceramic plate that has an upper surface including a wafer placement surface and that contains an electrode; a plug insertion hole that is formed as at least a portion of a through-hole extending through the ceramic plate in an up-down direction, an internal thread portion being on an inner circumferential surface around the plug insertion hole; and an insulating plug that includes an external thread portion screwed on the internal thread portion on an outer circumferential surface and that allows gas to pass therethrough.

As for the member for semiconductor manufacturing apparatus, the plug that allows the gas to pass therethrough is screwed and secured in the plug insertion hole of the ceramic plate. For this reason, it is not necessary for the plug to be fired when the plug is secured in the plug insertion hole. Accordingly, the member for semiconductor manufacturing apparatus that includes the plug can be provided at low costs.

In the present specification, the words "up-down", "left-right", and "front-rear" are used to describe the present invention in some cases, but the words "up-down", "left-right", and "front-rear" merely represent relative positional relationships. For this reason, the word "up-down" is changed into the word "left-right" or the word "left-right" is changed into the word "up-down" in some cases where the direction of the member for semiconductor manufacturing apparatus is changed. These cases are also included in the technical scope of the present invention.

As for the member for semiconductor manufacturing apparatus according to the present invention, the wafer placement surface may have a large number of small projections that support a wafer, and an upper surface of the plug may be lower than upper surfaces of the small projections. Consequently, the upper surface of the plug does not lift the wafer. In this case, the upper surface of the plug may be flush with a reference surface of the wafer placement surface on which the small projections are not formed or may be lower than the reference surface by 0.1 mm or less. This enables the height of a space between a back surface of the wafer and the upper surface of the plug to be decreased, and the space prevents spark discharge from occurring.

As for the member for semiconductor manufacturing apparatus according to the present invention, at least a part of the external thread portion may be stuck to the internal thread portion. This prevents the thread of the plug from being loosened due to the use of the member for semiconductor manufacturing apparatus.

As for the member for semiconductor manufacturing apparatus according to the present invention, the plug may be a porous body. The porous body has a large number of fine pores and is suitable for the plug that allows the gas to pass therethrough. In this case, the external thread portion may be densified. This prevents the external thread portion from being rubbed and producing, for example, powder when the external thread portion of the plug that is the porous body is screwed on the internal thread portion of the plug insertion hole.

As for the member for semiconductor manufacturing apparatus according to the present invention, the plug may be a columnar member, and the plug insertion hole may be a columnar hole. Consequently, the plug and the plug insertion hole have a relatively simple shape, and the plug and the plug insertion hole can be readily made.

As for the member for semiconductor manufacturing apparatus according to the present invention, the plug may include a head that has an inverted truncated cone shape and a leg that has a columnar shape, and the external thread portion may not be formed on an outer circumferential surface of the head but may be formed on an outer circumferential surface of the leg. The plug insertion hole may include a head correspondence portion that has the same shape as the head and a leg correspondence portion that has the same shape as the leg, and the internal thread portion may not be formed on an inner circumferential surface around the head correspondence portion but may be formed on an inner circumferential surface around the leg correspondence portion. This eliminates the necessity to provide a thread for the head of the plug and the head correspondence portion of the plug insertion hole.

DETAILED DESCRIPTION OF THE INVENTION

Figure 1:
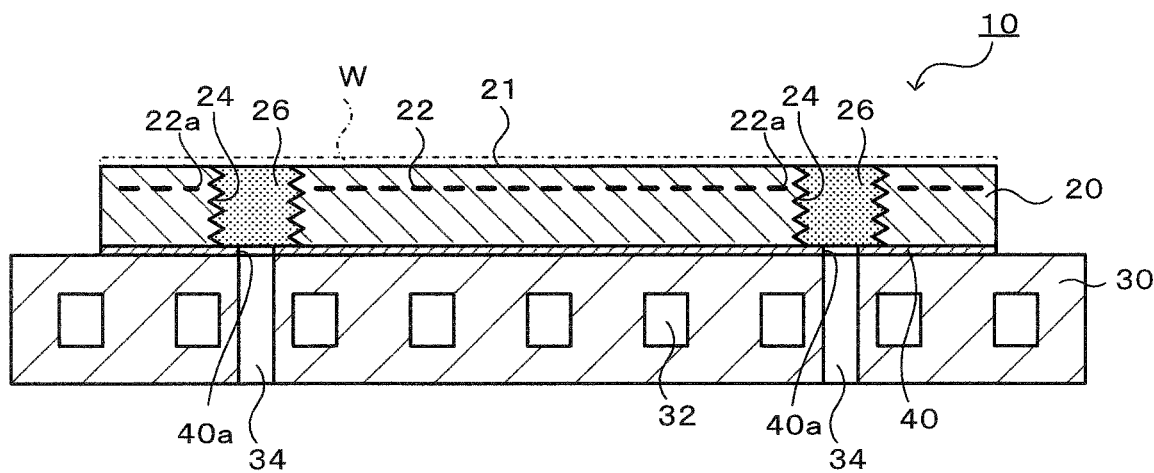
FIG. 1 illustrates a longitudinal section of a member 10 for semiconductor manufacturing apparatus.
Figure 2:
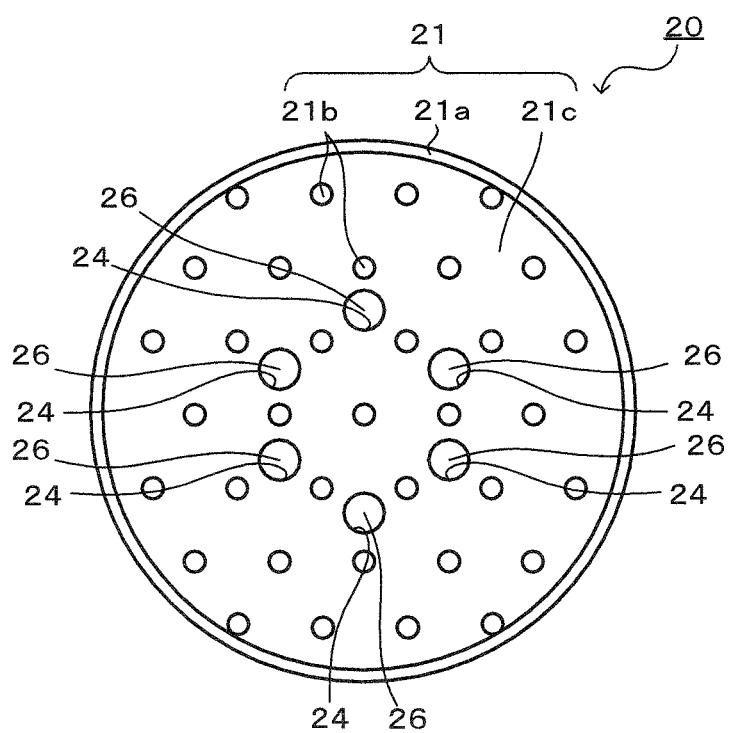
FIG. 2 illustrates a plan view of a ceramic plate 20.
Figure 3:
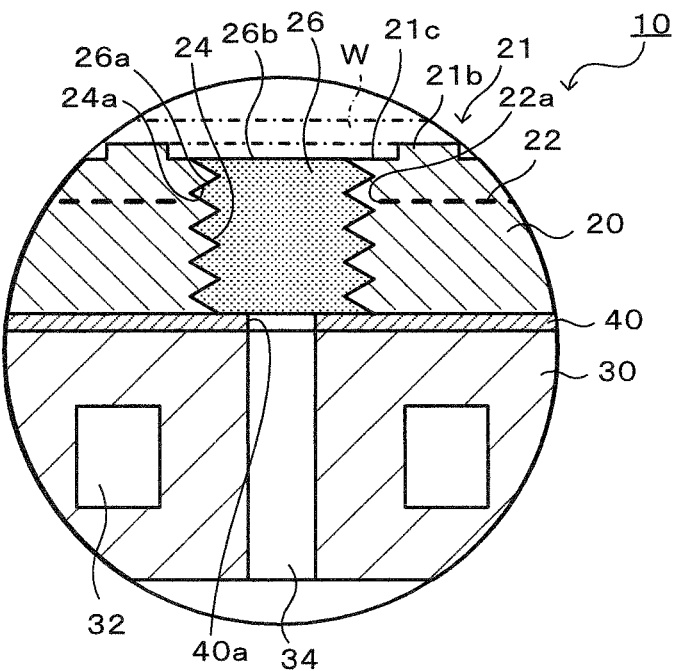
FIG. 3 illustrates a partially enlarged view of a part in FIG. 1.

A preferred embodiment of the present invention will now be described with reference to the drawings. FIG. 1 illustrates a longitudinal section of a member 10 for semiconductor manufacturing apparatus. FIG. 2 illustrates a plan view of a ceramic plate 20. FIG. 3 illustrates a partially enlarged view of a part in FIG. 1.

The member 10 for semiconductor manufacturing apparatus includes the ceramic plate 20, plug insertion holes 24, plugs 26, and a cooling plate 30.

The ceramic plate 20 is a ceramic disk (having, for example, a diameter of 300 mm and a thickness of 5 mm) such as an alumina sintered body or an aluminum nitride sintered body. An upper surface of the ceramic plate 20 is a wafer placement surface 21. The ceramic plate 20 contains an electrode 22. As illustrated in FIG. 2, a seal band 21a is formed on the wafer placement surface 21 of the ceramic plate 20 along an outer edge, and multiple circular small projections 21b are formed on the entire surface. The seal band 21a and the circular small projections 21b have the same height, and the height thereof is, for example, several μm to several tens of μm. The electrode 22 is a mesh electrode that is used as an electrostatic electrode and that has a flat plate shape, and a direct voltage can be applied thereto. When the direct voltage is applied to the electrode 22, a wafer W is attracted and secured to the wafer placement surface 21 (specifically, an upper surface of the seal band 21a and upper surfaces of the circular small projections 21b) due to electrostatic attraction force. When applying the direct voltage ends, the wafer W that is attracted and secured to the wafer placement surface 21 is released. The electrode 22 is used as a RF electrode in some cases. Specifically, an upper electrode (not illustrated) is disposed above the wafer placement surface 21, and plasma is generated when high-frequency power is supplied between parallel flat plate electrodes that include the upper electrode and the electrode 22 that is contained in the ceramic plate 20. The electrode 22 has through-holes 22a through which the plugs 26 extend. A portion of the wafer placement surface 21 on which the seal band 21a and the circular small projections 21b are not formed is referred to as a reference surface 21c.

The plug insertion holes 24 are through-holes that extend through the ceramic plate 20 in an up-down direction. As illustrated in FIG. 3, around each plug insertion hole 24, an internal thread portion 24a is on an inner circumferential surface. The plug insertion holes 24 are formed at multiple positions (for example, multiple positions equally spaced from each other in a circumferential direction) in the ceramic plate 20. According to the present embodiment, the plug insertion holes 24 are columnar holes (having, for example, an opening diameter of 8 mm and a total length (a length in the up-down direction) of 5 mm).

Each plug 26 is an electrically insulating columnar member (for example, the outer diameters of an upper bottom and a lower bottom are 8 mm, and a total length (a length in the up-down direction) is 5 mm) that allows gas to pass therethrough in the up-down direction. As illustrated in FIG. 3, the plug 26 includes an external thread portion 26a that can be screwed on the internal thread portion 24a on an outer circumferential surface. An upper surface 26b of the plug 26 is lower than the upper surface of the seal band 21a and the upper surfaces of the small projections 21b. According to the present embodiment, the upper surface 26b of the plug 26 is flush with the reference surface 21c of the wafer placement surface 21. The total length of the plug 26 is equal to the total length of each plug insertion hole 24. The plug 26 is a porous body and is a ceramic porous body according to the present embodiment. An example of the ceramic porous body can be a porous body composed of the same material as the ceramic plate 20.

The cooling plate 30 is a disk (a disk that has a diameter equal to or larger than the diameter of the ceramic plate 20) that has good thermal conductivity. The cooling plate 30 contains a refrigerant flow path 32 through which refrigerant circulates and gas supply paths 34 on which gas is supplied to the plugs 26. The refrigerant flow path 32 is formed in a one-stroke pattern from an inlet to an outlet over the entire cooling plate 30 in a plan view. Examples of the material of the cooling plate 30 include a metal material and a metal matrix composite material (MMC). Examples of the metal material include Al, Ti, Mo, or an alloy thereof. Examples of the MMC include a material containing Si, SiC, and Ti (also referred to as SiSiCTi) and a material obtained by impregnating a SiC porous body with Al and/or Si. The cooling plate 30 and the ceramic plate 20 are joined to each other with a joining layer 40 interposed therebetween. The joining layer 40 may be a resin layer or a metal layer. In the case where the joining layer 40 is the metal layer, the material of the cooling plate 30 is preferably a material that has a thermal expansion coefficient close to that of the ceramic plate 20. The joining layer 40 has holes 40a that extend therethrough in the up-down direction at positions at which the holes 40a face the plug insertion holes 24 and the gas supply paths 34.

An example of the use of the member 10 for semiconductor manufacturing apparatus thus configured will now be described. The wafer W is first placed on the wafer placement surface 21 with the member 10 for semiconductor manufacturing apparatus installed in a chamber not illustrated. The pressure of the chamber is decompressed by a vacuum pump and is adjusted such that a predetermined degree of vacuum is achieved. A direct voltage is applied to the electrode 22 of the ceramic plate 20 to generate electrostatic attraction force, and the wafer W is attracted and secured to the wafer placement surface 21 (specifically, the upper surface of the seal band 21a and the upper surfaces of the circular small projections 21b). Subsequently, a reactive gas atmosphere at a predetermined pressure (for example, several tens of Pa to several hundreds of Pa) is created in the chamber. In this state, a high-frequency voltage is applied between an upper electrode, not illustrated, on a ceiling portion in the chamber and the electrode 22 of the member 10 for semiconductor manufacturing apparatus, and plasma is generated. The high-frequency voltage may not be applied between the upper electrode and the electrode 22, but the high-frequency voltage may be applied between the upper electrode and the cooling plate 30. The surface of the wafer W is processed by the generated plasma. The refrigerant circulates through the refrigerant flow path 32 of the cooling plate 30. Backside gas is introduced into the gas supply paths 34 from a gas tank not illustrated. Heat conduction gas (such as helium) is used as the backside gas. The backside gas passes through the gas supply paths 34 and the plugs 26, is supplied to a space between the back surface of the wafer W and the reference surface 21c of the wafer placement surface 21, and is sealed. The backside gas enables heat conduction between the wafer W and the ceramic plate 20 to be efficient.

An example of manufacturing the member 10 for semiconductor manufacturing apparatus will now be described. The ceramic plate 20 and the plugs 26 are first prepared. The ceramic plate 20 and the plugs 26 are described above. Subsequently, the plugs 26 are screwed into the plug insertion holes 24 of the ceramic plate 20. Specifically, adhesive handles are stuck to the upper surfaces or lower surfaces of the plugs 26, the handles are pinched, and the plugs 26 are screwed from the upper openings or lower openings of the plug insertion holes 24. At this time, the plugs 26 are screwed such that the upper surfaces 26b of the plugs 26 match the reference surface 21c of the wafer placement surface 21. Subsequently, the adhesive handles are removed, and the surfaces from which the handles are removed are cleaned as needed. Subsequently, the lower surface of the ceramic plate 20 and the upper surface of the cooling plate 30 are joined to each other by using a joining material. Consequently, the joining material serves as the joining layer 40, and the member 10 for semiconductor manufacturing apparatus is obtained.

As for the member 10 for semiconductor manufacturing apparatus described in detail above, the plugs 26 that allow the gas to pass therethrough are screwed and secured in the plug insertion holes 24 of the ceramic plate 20. For this reason, it is not necessary for the plugs 26 to be fired when the plugs 26 are secured in the plug insertion holes 24. Accordingly, the member 10 for semiconductor manufacturing apparatus that includes the plugs 26 can be provided at low costs.

The upper surfaces 26b of the plugs 26 are lower than the upper surface of the seal band 21a and the upper surfaces of the circular small projections 21b. For this reason, the upper surfaces 26b of the plugs 26 do not lift the wafer W.

The upper surfaces 26b of the plugs 26 are flush with the reference surface 21c of the wafer placement surface 21. For this reason, the heights of spaces between the lower surface of the wafer W and the upper surfaces 26b of the plugs 26 can be decreased. Accordingly, the spaces prevent spark discharge from occurring.

The plugs 26 are columnar members, and the plug insertion holes 24 are columnar holes, and these have a relatively simple shape. Accordingly, the plugs 26 and the plug insertion holes 24 can be readily made.

The outer circumferential surfaces of the plugs 26 and the inner circumferential surfaces around the plug insertion holes 24 have threads and have a zigzag shape in the up-down direction. Consequently, the distances from the wafer W to the cooling plate 30 via spaces between the outer circumferential surfaces of the plugs 26 and the inner circumferential surfaces around the plug insertion holes 24 are longer than those in the case where no threads are formed. For this reason, creeping discharge can be prevented from occurring between the wafer W and the cooling plate 30.

In the case where the member 10 for semiconductor manufacturing apparatus is used for a long period of time, the upper surfaces 26b of the plugs 26 is wasted, and the upper surfaces 26b become lower than the reference surface 21c, the upper surfaces 26b of the plugs 26 can be flush with the reference surface 21c again by adjusting depth to which the plugs 26 are screwed into the plug insertion holes 24.

The present invention is not limited to the above-described embodiment, and can be carried out by various modes as long as they belong to the technical scope of the invention.

Figure 4:
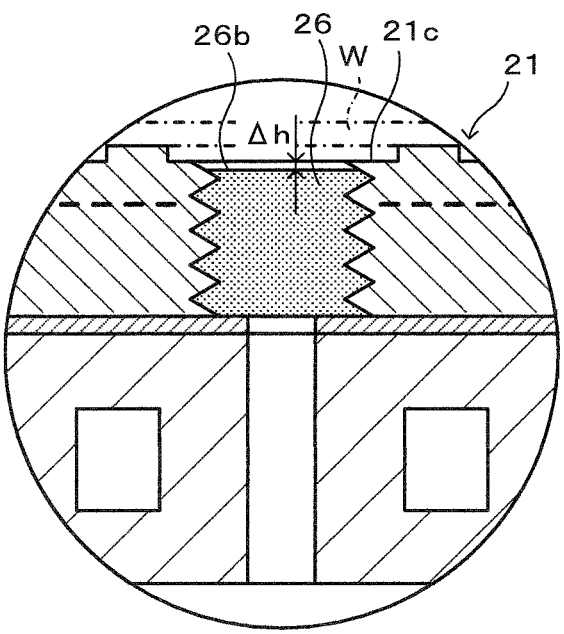
FIG. 4 is a partially enlarged view illustrating another example of a plug 26.

According to the embodiment described above, the upper surfaces 26b of the plugs 26 and the reference surface 21c of the wafer placement surface 21 are flush with each other but are not particularly limited thereto. For example, as illustrated in FIG. 4, a difference Δh obtained by subtracting the height of the upper surface 26b of each plug 26 from the height of the reference surface 21c of the wafer placement surface 21 may be 0.1 mm or less. In other words, the upper surfaces 26b of the plugs 26 may be lower than the reference surface 21c of the wafer placement surface 21 by 0.1 mm or less. Also, this enables the heights of the spaces between the lower surface of the wafer W and the upper surfaces 26b of the plugs 26 to be relatively low. Accordingly, the spaces prevent spark discharge from occurring.

Figure 5:
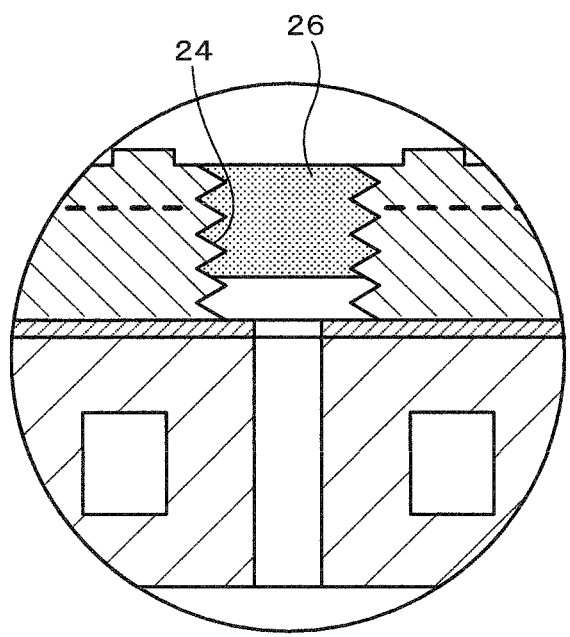
FIG. 5 is a partially enlarged view illustrating another example of the plug 26.
Figure 6:
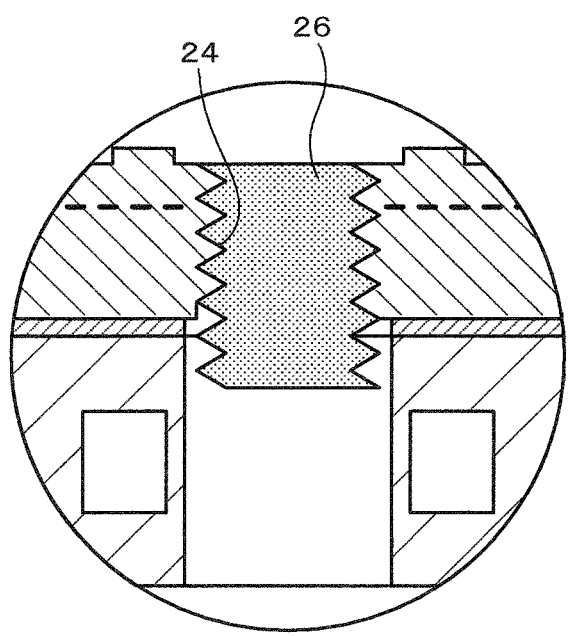
FIG. 6 is a partially enlarged view illustrating another example of the plug 26.
Figure 7:
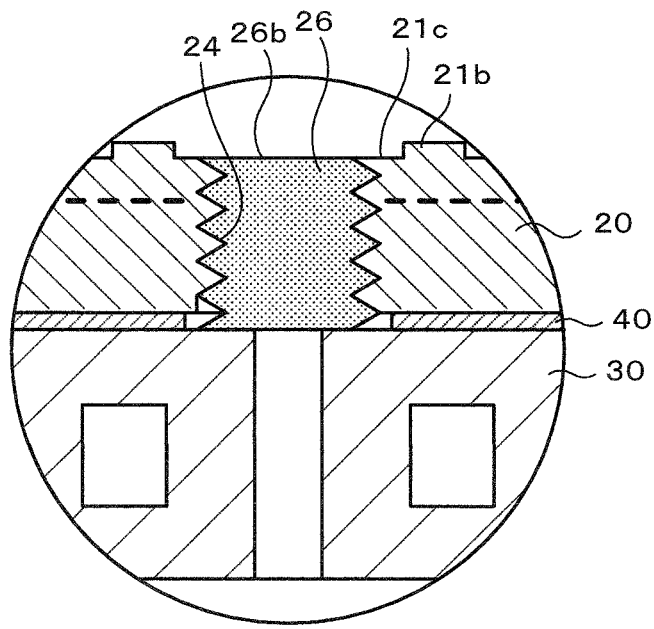
FIG. 7 is a partially enlarged view illustrating another example of the plug 26.

According to the embodiment described above, the total length of each plug 26 and the total length of each plug insertion hole 24 are equal to each other but are not particularly limited thereto. For example, as illustrated in FIG. 5, the total length of the plug 26 may be shorter than the total length of the plug insertion hole 24. As illustrated in FIG. 6, the total length of the plug 26 may be longer than the total length of the plug insertion hole 24. As illustrated in FIG. 7, the total length of the plug 26 may be equal to the sum of the total length of the plug insertion hole 24 and the thickness of the joining layer 40. In FIG. 7, the ceramic plate 20 and the cooling plate 30 are jointed to each other by using the joining layer 40, and the plugs 26 are subsequently screwed into the plug insertion holes 24 from the upper openings of the plug insertion holes 24 until the lower surfaces of the plugs 26 reach the upper surface of the cooling plate 30. Consequently, the upper surfaces 26b of the plugs 26 are flush with the reference surface 21c of the wafer placement surface 21. In FIG. 5 to FIG. 7, the upper surfaces 26b of the plugs 26 may be lower than the reference surface 21c of the wafer placement surface 21 by 0.1 mm or less as illustrated in FIG. 4.

Figure 8:
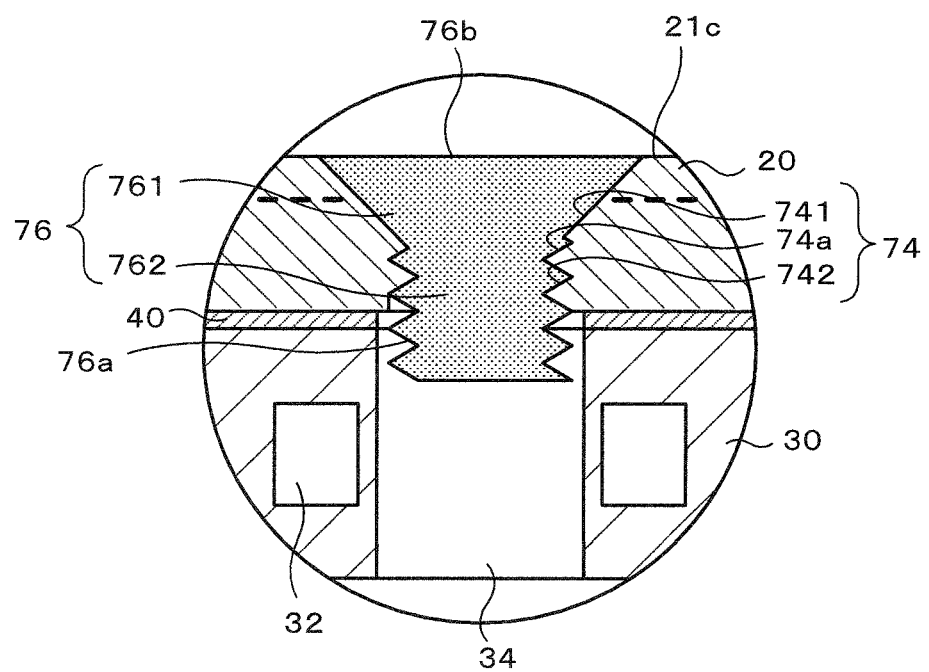
FIG. 8 illustrates a partially enlarged view of a plug 76.

According to the embodiment described above, the plugs 26 are columnar members, and the plug insertion holes 24 are columnar holes but are not particularly limited thereto. For example, a plug 76 and a plug insertion hole 74 illustrated in FIG. 8 may be used. The plug 76 includes a head 761 that has an inverted truncated cone shape and a leg 762 that has a columnar shape. An external thread portion 76a is not formed on an outer circumferential surface of the head 761 but is formed on an outer circumferential surface of the leg 762. The plug insertion hole 74 includes a head correspondence portion 741 corresponding to a space that has the same shape as the head 761 and a leg correspondence portion 742 corresponding to a space that has the same shape as the leg 762. An internal thread portion 74a is not formed on an inner circumferential surface around the head correspondence portion 741 but is formed on an inner circumferential surface around the leg correspondence portion 742. This eliminates the necessity to provide a thread for the head 761 of the plug 76 and the head correspondence portion 741 of the plug insertion hole 74. In this case, an upper surface 76b of the head 761 is preferably designed to be flush with the reference surface 21c when the outer circumferential surface of the head 761 of the plug 76 matches the inner circumferential surface around the head correspondence portion 741 of the plug insertion hole 74. Consequently, in the case where the plug 76 is mounted in the plug insertion hole 74, the upper surface 76b of the head 761 is flush with the reference surface 21c when the plug 76 is screwed into the plug insertion hole 74 and has a collision.

Figure 9:
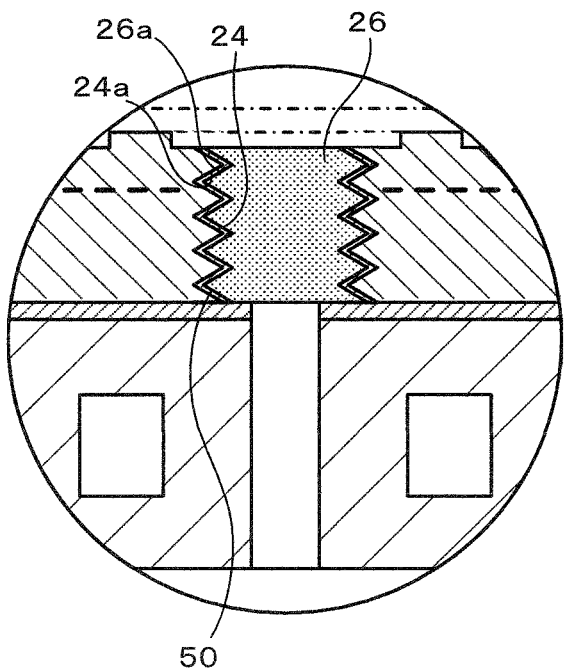
FIG. 9 illustrates a partially enlarged view of the plug 26 that is stuck in a plug insertion hole 24.
Figure 10:
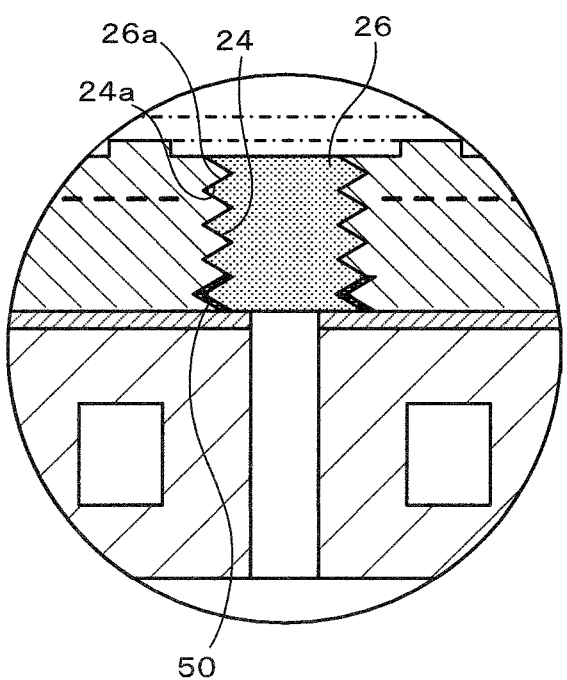
FIG. 10 illustrates a partially enlarged view of the plug 26 that is stuck in the plug insertion hole 24.

According to the embodiment described above, as illustrated in FIG. 9, the internal thread portions 24a around the plug insertion holes 24 and the external thread portions 26a of the plugs 26 may be stuck to each other by using adhesive layers 50. An organic adhesive may be used, an inorganic adhesive may be used, or a brazing metal material may be used for the adhesive layers 50. This prevents the external thread portions 26a of the plugs 26 from being loosened due to the use of the member 10 for semiconductor manufacturing apparatus. As illustrated in FIG. 10, the adhesive layers 50 may be disposed only near the lower openings of the plug insertion holes 24 between the internal thread portions 24a and the external thread portions 26a. Also, in FIG. 4 to FIG. 8, the adhesive layers 50 illustrated in FIG. 9 and FIG. 10 may be provided.

According to the embodiment described above, dense layers may be formed on the surfaces of the external thread portions 26a of the plugs 26 that are porous bodies. This prevents the external thread portions 26a from being rubbed and producing, for example, powder when the external thread portions 26a of the plugs 26 are screwed on the internal thread portions 24a around the plug insertion holes 24. For example, a method of forming the dense layers is to cover the surfaces of the external thread portions 26a by heat-resistant resin tubes or sheets and to bring heat-resistant resin films into close contact by hot air heating or heating in a furnace or to form thermally sprayed dense films on the surfaces of the external thread portions 26a by thermal spraying.

Figure 11:
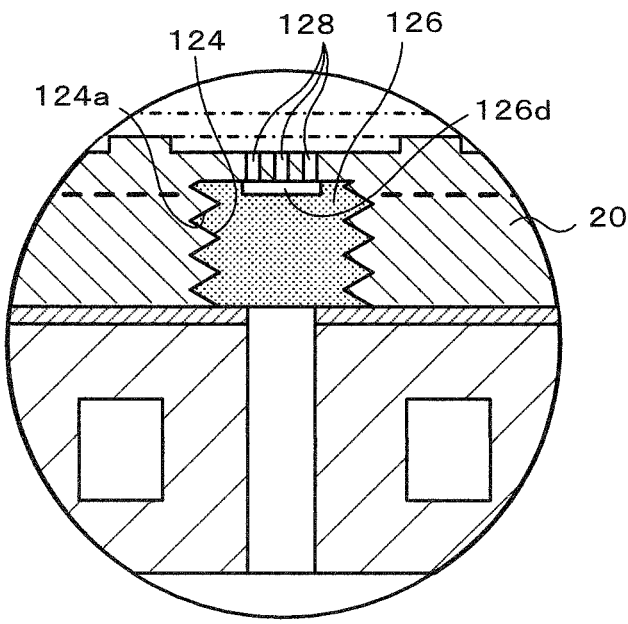
FIG. 11 is a partially enlarged view illustrating an example in which a plug insertion hole 124 is formed as a portion of a through-hole.

According to the embodiment described above, through-holes that extend through the ceramic plate 20 in the up-down direction are entirely used as the plug insertion holes 24, but this is not a particular limitation. For example, as illustrated in FIG. 11, an upper portion of a through-hole that extends through the ceramic plate 20 in the up-down direction may be formed as multiple thin holes 128 and a lower portion of the through-hole may be formed as a plug insertion hole 124. That is, the plug insertion hole 124 may be formed as a portion of the through-hole. Around the plug insertion hole 124, an internal thread portion 124a is on an inner circumferential surface. A plug 126 is substantially the same as the plugs 26 according to the embodiment described above except that a space 126d in communication with the multiple thin holes 128 is formed on an upper surface. Also, this achieves the same effects as the embodiment described above.

Figure 12:
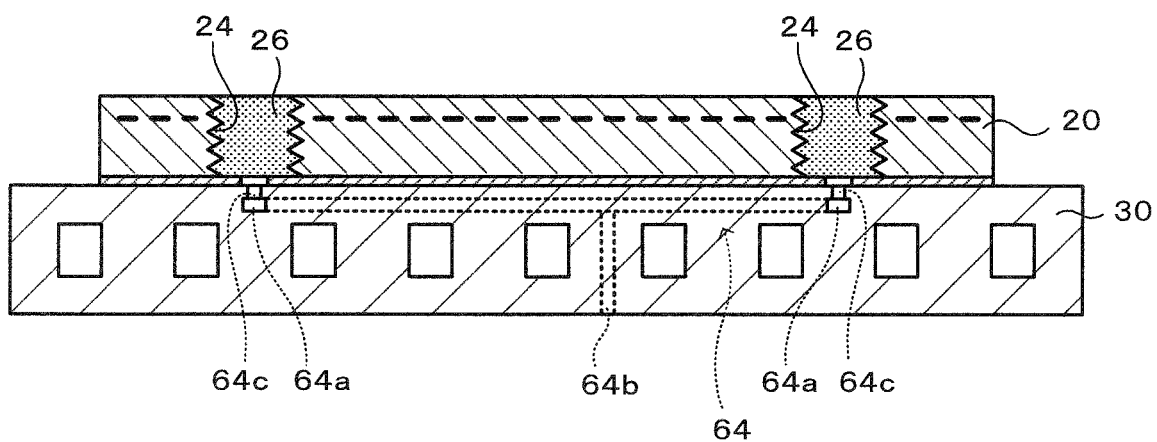
FIG. 12 is a longitudinal section illustrating an example in which a cooling plate 30 has a gas supply path 64.

According to the embodiment described above, holes that extend through the cooling plate 30 in the up-down direction are formed as the gas supply paths 34, but this is not a particular limitation. The cooling plate 30 may have a gas supply path 64 illustrated in FIG. 12. The gas supply path 64 includes a ring portion 64a that is concentric with the cooling plate 30 in a plan view, an introduction portion 64b via which gas is introduced into the ring portion 64a from a back surface of the cooling plate 30, and distribution portions 64c that distribute the gas from the ring portion 64a to the respective plugs 26. The number of the introduction portion 64b may be smaller than the number of distribution portions 64c and may be, for example, one. This enables the number of a gas pipe that is connected to the cooling plate 30 to be smaller than the number of the plugs 26. In this case, the plugs 26 are screwed from the upper openings of the plug insertion holes 24.

Figure 13:
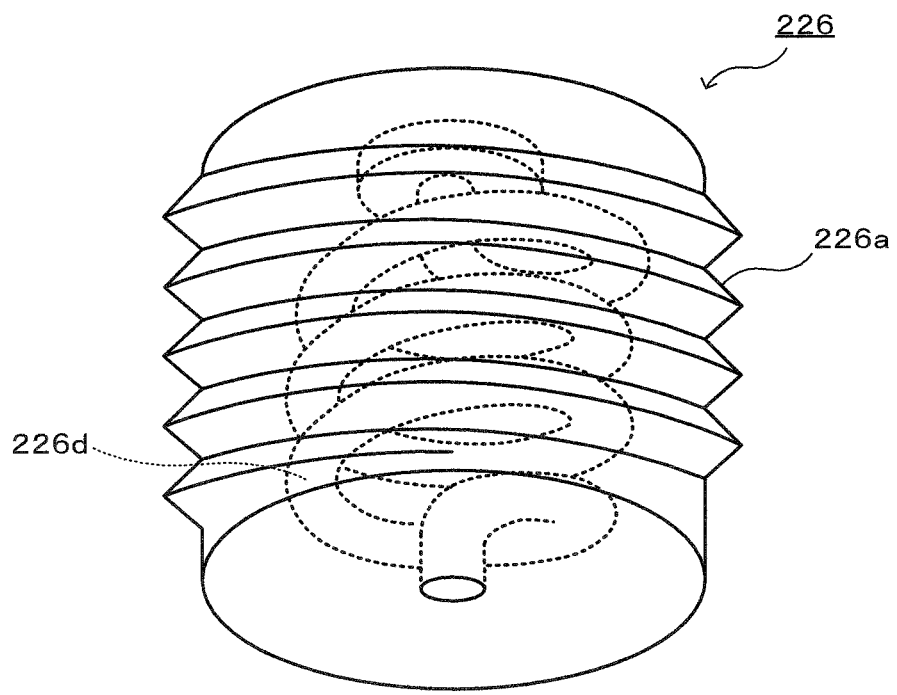
FIG. 13 illustrates a perspective view of a plug 226 obliquely viewed from below.

According to the embodiment described above, the plugs 26 that are porous bodies are used but are not particularly limited thereto. For example, the plugs 26 may be obtained by crushing insulating ceramics into fine pieces and solidifying the fine pieces by using an inorganic adhesive such that the plugs 26 are permeable, may be obtained by solidifying glass fibers by using an inorganic adhesive such that the plugs 26 are permeable, or may be obtained by using a heat-resistant Teflon resin sponge (Teflon is a registered trademark). Alternatively, as illustrated in FIG. 13, a plug 226 that includes an external thread portion 226a on an outer circumferential surface of a ceramic dense body having a columnar shape and that has an inner flow path 226d that extends therethrough in the up-down direction while bending and that has a spiral shape may be used.

According to the embodiment described above, an electrostatic electrode is taken as an example of the electrode 22 that is contained in the ceramic plate 20, but this is not a particular limitation. For example, a heater electrode (a resistance heating element) may be contained in the ceramic plate 20, or a RF electrode may be contained therein, instead of or in addition to the electrode 22.

The present application claims priority from Japanese Patent Application No. 2021-165314 filed Oct. 7, 2021, the entire contents of which are incorporated herein by reference.

What is claimed is:
1. A member for semiconductor manufacturing apparatus comprising:
  a ceramic plate that has an upper surface including a wafer placement surface and that contains an electrode;
  a plug insertion hole that is formed as at least a portion of a through-hole extending through the ceramic plate in an up-down direction, an internal thread portion being on an inner circumferential surface around the plug insertion hole; and an insulating plug that includes an external thread portion screwed on the internal thread portion on an outer circumferential surface and that allows gas to pass therethrough;

wherein the plug is a porous body; and wherein the external thread portion is densified.

2. The member for semiconductor manufacturing apparatus according to claim 1, wherein the wafer placement surface has a large number of small projections that support a wafer, and an upper surface of the plug is lower than upper surfaces of the small projections.

3. The member for semiconductor manufacturing apparatus according to claim 2, wherein the upper surface of the plug is flush with a reference surface of the wafer placement surface on which the small projections are not formed or is lower than the reference surface by 0.1 mm or less.

4. The member for semiconductor manufacturing apparatus according to claim 1, wherein at least a part of the external thread portion is stuck to the internal thread portion.

5. The member for semiconductor manufacturing apparatus according to claim 1, wherein the plug is a columnar member, and the plug insertion hole is a columnar hole.

6. The member for semiconductor manufacturing apparatus according to claim 1, wherein the plug includes a head that has an inverted truncated cone shape and a leg that has a columnar shape, and the external thread portion is not formed on an outer circumferential surface of the head but is formed on an outer circumferential surface of the leg, wherein the plug insertion hole includes a head correspondence portion that has the same shape as the head and a leg correspondence portion that has the same shape as the leg, and the internal thread portion is not formed on an inner circumferential surface around the head correspondence portion but is formed on an inner circumferential surface around the leg correspondence portion.

7. The member for semiconductor manufacturing apparatus according to claim 1, wherein an upper portion of the through-hole is formed as multiple thin holes and a lower portion of the through-hole is formed as the plug insertion hole.

8. The member for semiconductor manufacturing apparatus according to claim 1, wherein the insulating plug includes an inner flow path that extends therethrough in an up-down direction while bending in a spiral shape.

9. A member for semiconductor manufacturing apparatus comprising:

a ceramic plate that has an upper surface including a wafer placement surface and that contains an electrode;

a plug insertion hole that is formed as at least a portion of a through-hole extending through the ceramic plate in an up-down direction, an internal thread portion being on an inner circumferential surface around the plug insertion hole; and an insulating plug that includes an external thread portion screwed on the internal thread portion on an outer circumferential surface and that allows gas to pass therethrough;

wherein the plug includes a head that has an inverted thrucated cone shape and a leg that has a columnar shape, and the external thread portion is not formed on an outer circumferential surface of the head but is formed on an outer circumferential surface of the leg; and wherein the plug insertion hole includes a head correspondence portion that has the same shape as the head and a leg correspondence portion that has the same shape as the leg, and the internal thread portion is not formed on an iner circumferential surface around the head correspondence portion but is formed on an inner circumferential surface around the leg correspondence portion.

10. The member for semiconductor monufacturing apparatus according to claim 9, wherein the wafer placement surface has a large number of small projections that support a wafer, and an upper surface of the plug is lower than upper surfaces of the small projections.

11. The member for semiconductor manufacturing apparatus according to claim 10, wherein the upper surface of the plug is flush with a reference surface of the wafer placement surface on which the small projections are not formed or is lower than the reference surface by 0.1 mm or less.

12. The member for semiconductor manufacturing apparatus according to claim 9, wherein at least a part of the external thread portion is stuck to the internal thread portion.

13. The member for semiconfuctor manufacturing apparatus according to claim 9, wehrein the plug is a porous body.

14. The member for semiconductor manufacturing apparatus according to claim 13, wherein the external thread portion is densified.

15. The member for semiconductor manufacturing apparatus according to claim 9, wherein the plug is a columnar member, and the plug insertion hole is a columnar hole.

16. The member for semiconductor manufacturing apparatus according to claim 9, wherein an upper portion of the through-hole is formed as multiple thin holes and a lower portion of the through-hole is formed as the plug insertion hole.

17. The member for semiconductor manufacturing apparatus according to claim 9, wherein the insulating plug includes an inner flow path that extends therethrough in an up-down direction while bending in a spiral shape.

* * * * *